US009024616B2

(12) United States Patent
Bucsa et al.

(10) Patent No.: US 9,024,616 B2
(45) Date of Patent: May 5, 2015

(54) SIGNALING CIRCUIT AND METHOD TO DETECT ZONE STATUS

(71) Applicant: Tyco Safety Products Canada Ltd., Concord (CA)

(72) Inventors: Andrei Bucsa, Toronto (CA); Stephen D. W. Fosty, Brampton (CA)

(73) Assignee: Tyco Safety Products Canada Ltd., Concord, Ontario (CA)

( * ) Notice: Subject to any disclaimer, the term of this patent is extended or adjusted under 35 U.S.C. 154(b) by 343 days.

(21) Appl. No.: 13/688,626

(22) Filed: Nov. 29, 2012

(65) Prior Publication Data
US 2013/0154613 A1 Jun. 20, 2013

Related U.S. Application Data

(60) Provisional application No. 61/577,303, filed on Dec. 19, 2011.

(51) Int. Cl.
*G01R 23/02* (2006.01)
*G01R 19/00* (2006.01)
*G06F 17/00* (2006.01)
*H02H 3/087* (2006.01)
*G08B 29/04* (2006.01)
*H02H 3/06* (2006.01)

(52) U.S. Cl.
CPC ............ *G01R 23/02* (2013.01); *G01R 19/00* (2013.01); *G06F 17/00* (2013.01); *H02H 3/06* (2013.01); *H02H 3/087* (2013.01); *G08B 29/04* (2013.01)

(58) Field of Classification Search
CPC ....................................................... G01R 1/071
USPC ................. 324/76, 96, 97; 250/336.1; 356/46
See application file for complete search history.

(56) References Cited

U.S. PATENT DOCUMENTS

| 3,811,126 | A | | 5/1974 | Winger |
| 4,162,488 | A | * | 7/1979 | Silverman et al. ............ 340/505 |
| 4,240,078 | A | | 12/1980 | Jalonen |
| 4,257,037 | A | | 3/1981 | Mongeon |
| 4,751,498 | A | | 6/1988 | Shalvi et al. |
| 6,169,389 | B1 | * | 1/2001 | Chen ............................. 320/166 |
| 6,441,719 | B1 | * | 8/2002 | Tsui ............................. 340/5.21 |
| 2010/0280922 | A1 | * | 11/2010 | Giovannotto ................... 705/27 |
| 2011/0187197 | A1 | * | 8/2011 | Moth ............................... 307/66 |

OTHER PUBLICATIONS

Patent Cooperation Treaty, International Search Report, mailed Dec. 3, 2013, for International Application No. PCT/CA2013/050678.

* cited by examiner

*Primary Examiner* — Arleen M Vazques
*Assistant Examiner* — Dominic Hawkins
(74) *Attorney, Agent, or Firm* — Kacvinsky Daisak Bluni PLLC

(57) ABSTRACT

A bi-directional current limiter may be configured to receive an AC signal and bi-directionally limit the loop current to a predetermined current value. A first and second zone may be configured in series with the AC signal and bi-directional current limiter. The first and second zone may include unidirectional current limiters to limit a unidirectional current that is proportionately less than the bi-directionally limited current. A first opto-coupler circuit (ISO1) may be configured to detect both high and low current states in the current loop circuit. Second and third opto-coupler circuits (ISO2 and ISO3) associated with the first and second zones may be configured to detect only high current states in the current loop circuit. The status of the first and second zones may then be determined by an analysis of the current level in the current loop circuit during two half cycles as determined by the various current limiters.

14 Claims, 7 Drawing Sheets

FIG. 7
700

| | | | State Of: | | |
|---|---|---|---|---|---|
| 710 | 720 | 730 | 740 | 750 | 760 |
| K1/K2 State | AC Cycle | Loop Current | ISO 1 LOOP KEY | ISO 2 KEY 1 | ISO 3 KEY 2 |
| Scenario 1 K1 Open K2 Open | +ve | $I_1$ | $2*F_{IN}$ | OFF | OFF |
| | -ve | $-I_2$ | | OFF | OFF |
| Scenario 2 K1 Closed K2 Open | +ve | $I_3$ | $2*F_{IN}$ | ON | OFF |
| | -ve | $-I_2$ | | OFF | OFF |
| Scenario 3 K1 Open K2 Closed | +ve | $I_1$ | $2*F_{IN}$ | OFF | OFF |
| | -ve | $-I_3$ | | OFF | ON |
| Scenario 4 K1 Closed K2 Closed | +ve | $I_3$ | $2*F_{IN}$ | ON | OFF |
| | -ve | $-I_3$ | | OFF | ON |
| Scenario 5 Loop Open at A" | +ve | 0 | OFF | OFF | OFF |
| | -ve | 0 | OFF | OFF | OFF |
| Scenario 6 Loop Shorted | +ve | $I_3$ | $2*F_{IN}$ | ON | OFF |
| | -ve | $-I_3$ | | OFF | ON | e.g., $I_1 = I_2$
$I_1 = I_3 / 10$
$I_2 = I_3 / 10$

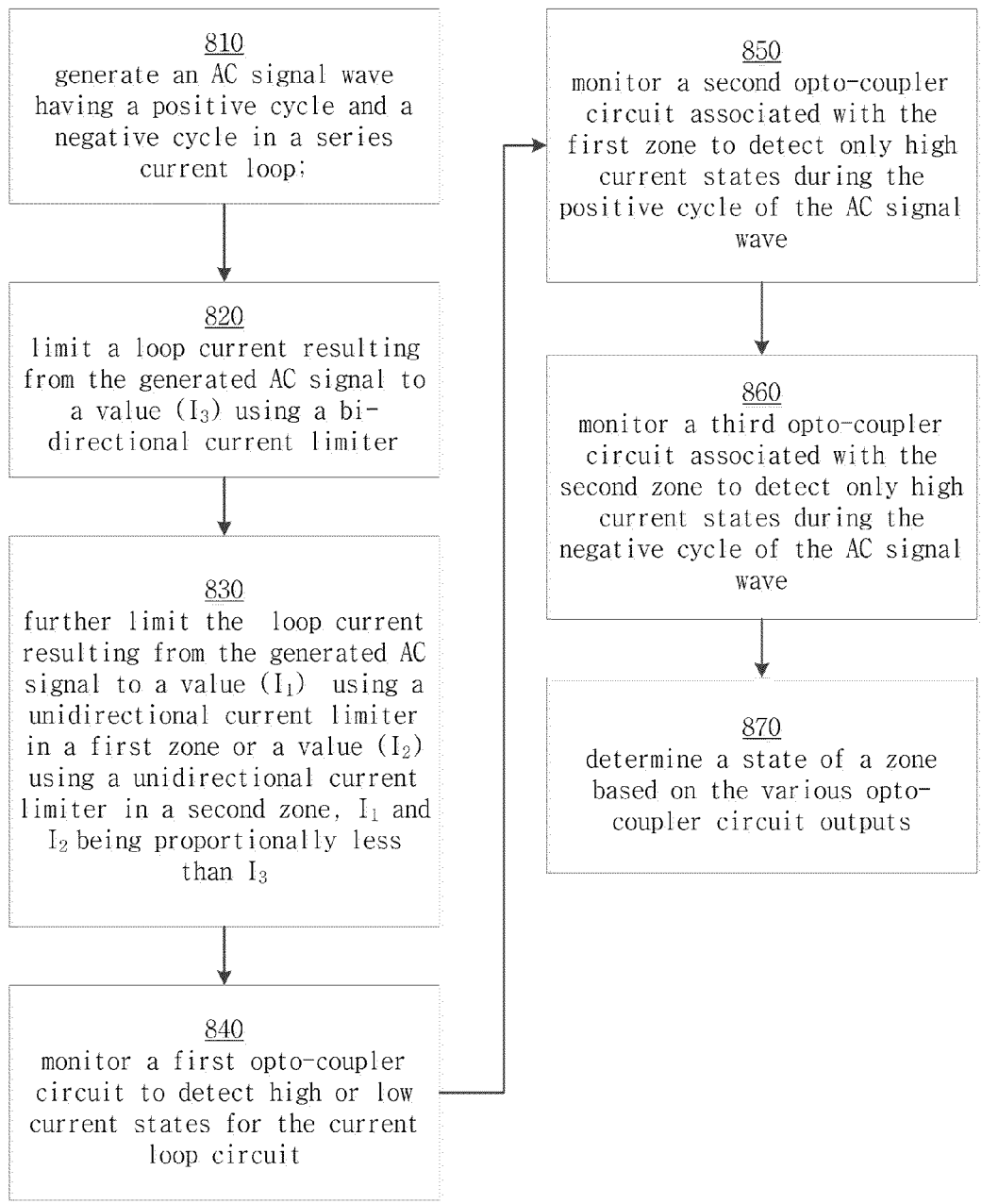

900

SIGNALING CIRCUIT AND METHOD TO DETECT ZONE STATUS

FIELD

Embodiments of the present disclosure relate to security alarm systems and associated methods for protecting residences, businesses and other premises. More particularly, the present disclosure relates to a signaling system and method pertaining to detecting zone status within a security system.

BACKGROUND

Security or alarm systems are installed in premises to detect hazardous or potentially hazardous conditions. A security system generally includes a plurality of detectors/sensors organized into zones, one or more keypads and a control panel which contains the system electronics and may include a communication interface for remote monitoring and two-way communication over telephone or wireless communication paths. Each of the detectors communicates with the control panel to provide notification of an alarm condition. Examples of possible alarm conditions include unauthorized entry or the unexpected presence of a person who may be an intruder, fire, smoke, toxic gas, high/low temperature conditions (e.g., freezing), flooding, power failure, etc. In other words, an alarm condition may represent any detectable condition that might lead to personal hazard or property damage. Audible and/or visible alarm devices such as sirens, lights, etc., may also be utilized to notify occupants of the existence of an alarm condition. The control panel may be located in a utility room, basement, etc., and may communicate with the detectors and notification devices by wired or wireless signal paths. A keypad, which may also communicate with the control panel via a wired or wireless connection, is used to arm/disarm the system as well as providing a means to display various system messages via a status display screen.

Monitoring and detecting the present zone status for a security alarm system is of great importance to ensure the proper functioning of the system. Existing zone signaling circuits and methods mostly rely on a DC voltage drop reading across a resistor to read end of line states. Such methods and circuits, however, are not as immune to common mode noise (e.g., zone loop is floating) or voltage additive noise (e.g., zone loop is a current loop). In addition, the DC voltage drop across a resistor methodology may not be as tamper resistant nor provide the level of zone isolation as the embodiments described herein. Other prior art systems may use complicated analog circuitry to achieve acceptable zone isolation. Complex circuitry increases the cost to the overall system, however, and for multiple inputs the solution may become non-marketable.

SUMMARY

Exemplary embodiments of the present disclosure are directed to a process of monitoring the zone status for security alarm systems in a manner that is low cost, highly reliable and efficient, exhibits robust immunity to both common noise and voltage additive noise, and ensures zone isolation. Zone isolation is typically a requirement for many fire applications. In addition, the embodiments presented herein are very tamper resistant and may also power the end-of-line sensors (e.g., detection devices $18_1 \ldots 18_n$) in the zones.

In one exemplary embodiment, a current loop circuit is disclosed that includes an AC signal generator to generate an AC signal having a positive cycle (+ve) and a negative cycle (−ve). A bi-directional current limiter may be configured to receive the AC signal and bi-directionally limit the loop current to a predetermined current value ($I_3$). A first zone may be configured to receive the AC signal, the first zone may include a unidirectional current limiter to limit a unidirectional current ($I_1$) that is proportionately less than the bi-directionally limited current $I_3$. A second zone may be configured to receive the AC signal, the second zone including a unidirectional current limiter to limit a unidirectional current ($I_2$) that is proportionally less than the bi-directionally limited current $I_3$ The first and second zones may be coupled in series with the AC signal generator. A first opto-coupler circuit (ISO1) may be configured to detect both high and low current states in the current loop circuit. A second opto-coupler circuit (ISO2) associated with the first zone may be configured to detect only high current states in the current loop circuit. A third opto-coupler circuit (ISO3) associated with the second zone may be configured to detect only high current states in the current loop circuit. The status of the first and second zones may then be determined by the current level in the current loop circuit as determined by the various current limiters.

In another exemplary embodiment, a method of zone signaling in an alarm system using a current loop circuit is disclosed. An AC signal wave having a positive cycle (+ve) and a negative cycle (−ve) may be generated. A high bi-directional current ($I_3$) may be created in the current loop circuit that is limited by a low unidirectional current ($I_1$) from a current limiter in a first zone and a low unidirectional current ($I_2$) from a current limiter in a second zone. The low unidirectional currents $I_1$ and $I_2$ may be proportionally less than $I_3$. A first opto-coupler circuit (ISO1) may be monitored to detect high or low current states for the current loop circuit. A second opto-coupler circuit (ISO2) associated with the first zone may be monitored to detect only high current states during the positive (+ve) cycle of the AC signal wave. A third opto-coupler circuit (ISO3) associated with the second zone may be monitored to detect only high current states during the negative (−ve) cycle of the AC signal wave. The status of the first and second zones may then be determined by the current level in the current loop circuit as determined by the various current limiters.

In another exemplary embodiment, zone status detection circuit is disclosed that includes an AC signal generator to generate an AC signal having a positive and negative cycle. The AC signal generator may be coupled in series with a first resistor, a first zone, a second zone, and a load resistor. The first resistor may have a value that ensures a comfortable current for a first opto-coupler circuit that is configured to detect current in the zone status detection circuit. The first zone may include a resistor coupled in parallel with a first diode that is conductive during the positive AC cycle and a first switch. The first zone may be associated with a second opto-coupler circuit configured to detect a voltage on the resistor in the first zone. The second zone may also include a resistor coupled in parallel with a second diode that is conductive during the negative AC cycle and a second switch. The second zone may be associated with a third opto-coupler circuit configured to detect a voltage on the resistor in the second zone. The load resistor may be set to a value to ensure there is no output on the second and third opto-coupler circuits when the first and second switches are both open but have a pulsed output on either the second or third opto-coupler circuit when an associated switch is closed.

BRIEF DESCRIPTION OF THE DRAWINGS

FIG. 7 illustrates a state truth table for the zone status signaling system in accordance with an embodiment of the present disclosure.

FIG. 8 illustrates a logic flow diagram in accordance with an embodiment of the present disclosure.

DESCRIPTION OF EMBODIMENTS

Figure 1:
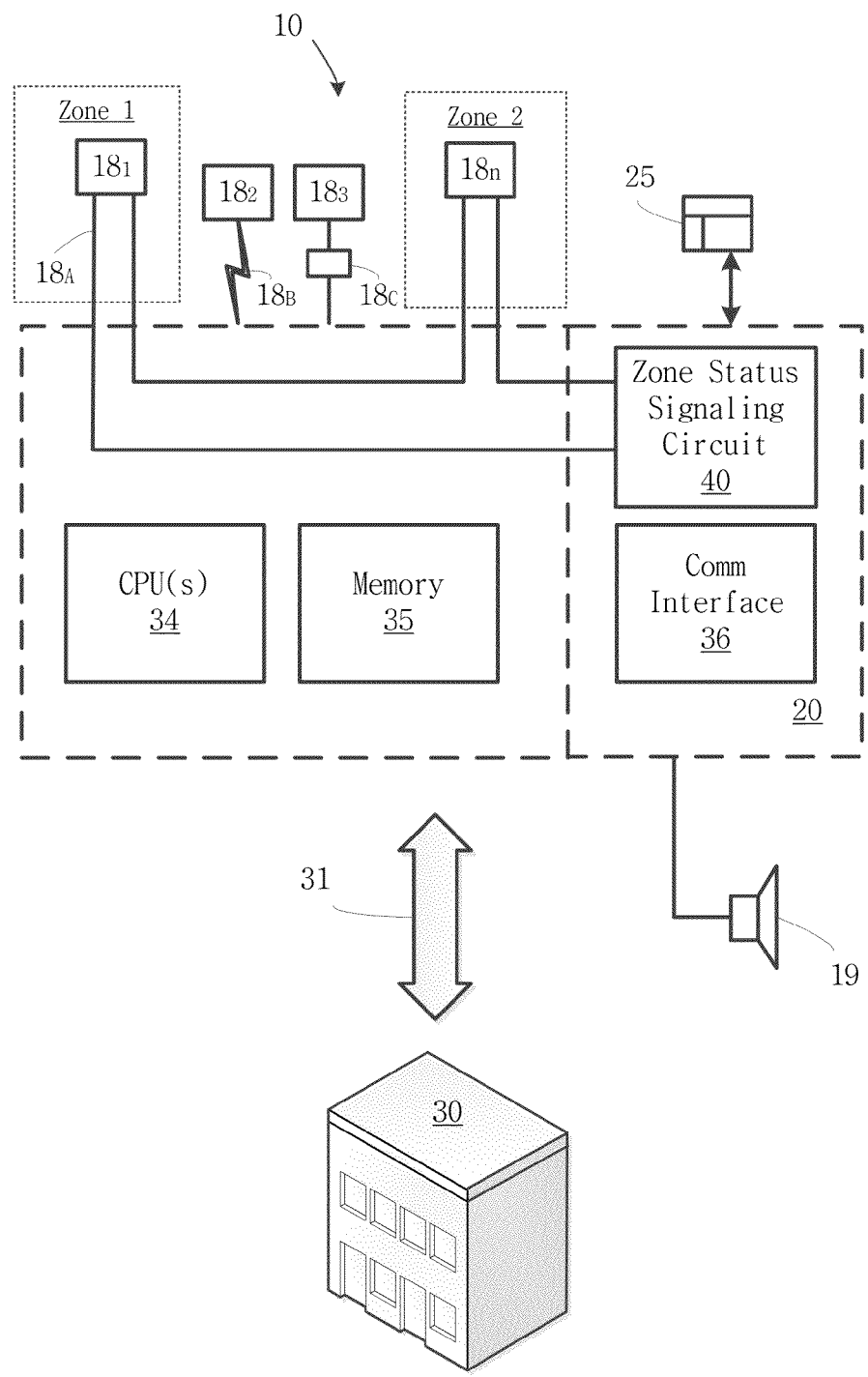
FIG. 1 illustrates a block diagram of an exemplary security system in accordance with an embodiment of the present disclosure.

The present disclosure will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 is a block diagram of a typical security system 10 embodying the present disclosure installed in a building or premises. Security system 10 includes a control panel 20 which generally controls operation of the system. A number of detection devices $18_1 \ldots 18_n$ are utilized to monitor an area. Detection devices may include, for example, motion detectors, door contacts, glass break detectors, smoke detectors, water leakage detectors, etc. Detection devices $18_1 \ldots 18_n$ communicate with panel 20 by a wired interconnect 18A, wirelessly 18B, through the electric wiring of the premises 18C, or otherwise. One or more user interfaces, such as keypad 25 is used to communicate with control panel 20 to arm, disarm, notify and generally control system 10. The alarm system 10 may further include other notification devices such as sirens, emergency lights, etc., referenced generally as 19.

Control panel 20 communicates with each of the detection devices $18_1 \ldots 18_n$, keypad 25 and notification devices 19 as well as communicating with a monitoring facility 30 which is typically geographically remote from the premises in which system 10 is installed. Control panel 20 may include a CPU 34, memory 35 and communicator 36. CPU 34 functions as a controller to control the various communication protocols within system 10. Memory 35 stores system parameters, detection device information, address information etc. Communicator 36 sends and receives signals to/from the monitoring facility 30 via communications link 31. Alternatively, communicator 36 may be a separate device that communicates with controller 20 via a hardwired or wireless connection.

When an alarm condition occurs based on the operation of one or more detection devices $18_1 \ldots 18_n$, a signal is transmitted from the respective detection device to control panel 20. Depending on the type of signal received from the one or more detection devices, communicator 36 communicates with monitoring facility 30 via link 31 to notify the monitoring facility that an alarm notification has occurred at the premises. Communication link 31 may be a POTS (Plain Old Telephone System), a broadband connection (e.g., internet), a cellular link such as GSM (Global System for Mobile communications) transmission, a voice-over-IP (VoIP) connection, etc. In certain security systems, keypad 25, control panel 20 and communicator 36 may be housed within a single unit.

As noted above, keypad 25 is used to communicate with control panel 20 to arm, disarm, notify and generally control system 10. Keypad 25 includes a status display which may include either individual indicators, such as discrete light emitting diodes or may include an LCD or LED display, capable of displaying messages regarding the status of particular detection devices $18_1 \ldots 18_n$ and/or operation of the system.

Each security system is given at least one unique access code (sometimes referred to as a PIN), which is generally a sequence of symbols (e.g. numbers, letters, characters, etc.) entered via keypad 25 used to arm and disarm system 10. When arming system 10, a user enters their access code and an exit delay time is provided before the detection devices $18_1 \ldots 18_n$ are activated so that a user may exit the premises before system 10 becomes armed. Conversely, upon entering the premises, the user enters the access code to disarm the system 10. An entry delay time period may be programmed into the system 10 to allow the user to enter the access code before the system goes into alarm mode.

As mentioned above, monitoring and detecting the zone status for a security system 10 is an important function. The embodiments herein describe zone monitoring and detection techniques via a zone status signaling circuit 40 that are low cost, highly reliable and efficient, exhibit robust immunity to both common noise and voltage additive noise, and ensure zone isolation. In addition, the embodiments presented herein are very tamper resistant and may also power the end-of-line sensors (e.g., detection devices $18_1 \ldots 18_n$) in the zones.

The zone status signaling circuit 40 may comprise multiple circuit elements dispersed throughout the security system 10. While the box labeled zone status detection circuitry 40 has been included within control panel 20, an actual implementation of the zone status detection circuitry may span other elements of the security system 10 including, but not limited to, detection devices $18_1 \ldots 18_n$ as organized into zones and the keypad 25. The embodiments are not limited to this example.

Figure 2:
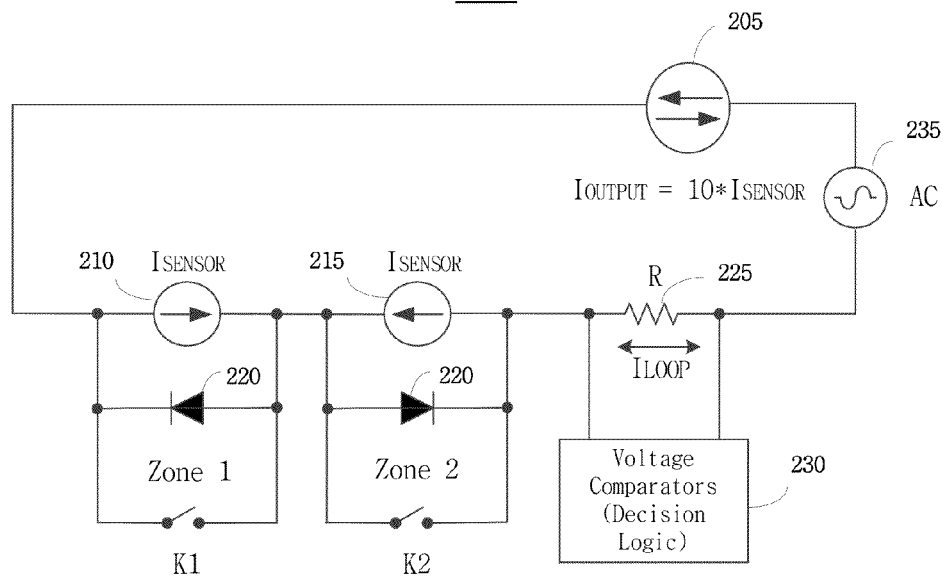
FIG. 2 illustrates a simplified block diagram of a current loop circuit for a zone status signaling system in accordance with an embodiment of the present disclosure.

FIG. 2 illustrates a simplified block diagram of a current loop circuit 200 for a zone status signaling circuit 40 in accordance with an embodiment of the present disclosure. The series coupled current loop circuit 200 includes one bi-directional current generator 205, two unidirectional current sources 210, 215—one for each zone, a resistance 225, and voltage comparator logic 230 across the resistor 225. The voltage comparator logic 230 may serve to determine the current in the loop and translate the loop current into a zone status. The loop is in series with and may be powered by an AC source 235.

When not self-biased, a current generator may act as a current limiter. Current limiting is the practice in electrical circuits of imposing an upper limit on the current that may be delivered to a load usually to protect a circuit from generating or transmitting too large a current. In the embodiments described herein, none of the current generators or current sources is self-biased. Thus, all the current generators or current sources referenced herein act as current limiters and are referred to as such.

In general, two current limiters coupled in series and set for different currents will cause the loop current ($I_{LOOP}$) to remain at the lower current value. In this case, there are actually three current limiters 205, 210, 215. There is a unidirectional current limiter 210 and 215 in each zone nominally set to limit the current to +I respective −I, which are referred (in absolute values) to as $I_{SENSOR}$. There is also a bi-directional current limiter 205 in the current loop circuit 200 nominally set to limit the current to +/−10I which is referred to as $I_{OUTPUT}$. In this example, the two unidirectional current limiters 210 and 215 work in tandem as each is set for a different cycle of an AC period for the AC source 235. If the loop is biased with the AC source 235 and a current limiter 210 or 215 in a zone is shorted with a diode 220 in reverse direction of the current limiter 210 or 215, the current may be limited by the current limiter 210 or 215 for one AC cycle and for the next AC cycle the current will not be limited and will flow through the diode 220. The bi-directional current limiter 205 will limit the current inside the current loop circuit 200 for both negative and positive cycles of the AC source 235. The bi-directional current limiter 205 is set to limit current at a value ten (10) times the current limit of the unidirectional current limiters 210, 215. Thus, at any given time, the loop current ($I_{LOOP}$) will either be limited to +/−$I_{SENSOR}$ or +/−$I_{OUTPUT}$ or being between the limit value and zero (0) around AC zero crossing or zero (0) if the loop is broken. The graph below illustrates the possibilities and how it relates to determining a zone status for both zones 1 and 2.

Figure 3:
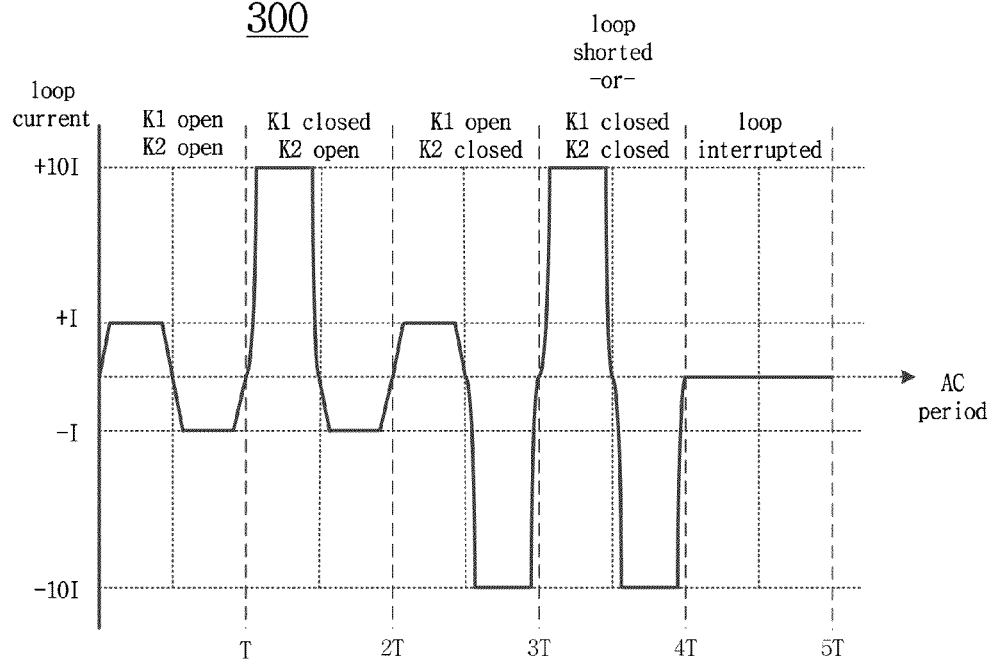
FIG. 3 illustrates a graph of potential loop current output based on zone status in accordance with an embodiment of the present disclosure.

FIG. 3 illustrates a graph 300 of potential loop current output based on zone status in accordance with an embodiment of the present disclosure. The x-axis of the graph represents successive AC periods while the y-axis represents the loop current. The graph has been artificially constructed to illustrate all of the possible scenarios and is not representative of any particular series of AC periods. Each AC period may be portioned into a positive cycle and a negative cycle. In this example, zone 1 has been arbitrarily associated with the positive cycle based on the direction of the unidirectional current limiter 210. Similarly, zone 2 has been arbitrarily associated with the negative cycle based on the direction of the unidirectional current limiter 215.

During the first AC period (T), the current loop value is +I for the positive cycle and −I for the negative cycle. For the positive cycle, this is indicative that the current limiter 210 is providing a limited current of +I to the current loop circuit 200. The bi-directional current limiter 205 is also supplying a limited current of +10I to the current loop circuit 200. However, since both the unidirectional current limiter 210 and the bi-directional current limiter 205 are coupled in series and set for different currents, the loop current ($I_{LOOP}$) will be the lower current value. The unidirectional current limiter 210 will only supply its current to the current loop circuit 200 if switch K1 is open. If switch K1 were closed, unidirectional current limiter 210 would be shorted and the directional current limiter 205 would supply the loop current. For the negative cycle, this is indicative that the current limiter 215 is providing a limited current of −I to the current loop circuit 200. The bi-directional current limiter 205 is also supplying a limited current of −10I to the current loop circuit 200. However, since both the unidirectional current limiter 215 and the bi-directional current limiter 205 are coupled in series and set for different currents, the loop current ($I_{LOOP}$) will be the lower current value. The unidirectional current limiter 215 will only supply its current to the current loop circuit 200 if switch K2 is open. If switch K2 were closed, unidirectional current limiter 215 would be shorted and the directional current limiter 205 would supply the loop current. Thus, the current loop values indicate that the switches K1 and K2 in zones 1 and 2 are both open. This indicates that each zone is in standby mode and that no alarm conditions exist in either zone.

During the second AC period (2T), the current loop value is +10I for the positive cycle and −I for the negative cycle. For the positive cycle, this is indicative that the current limiter 210 is not providing any current to the current loop circuit 200 indicating that switch K1 is closed. The bi-directional current limiter 205 is supplying a limited current of +10I to the current loop circuit 200. For the negative cycle, this is indicative that the current limiter 215 is providing a limited current of −I to the current loop circuit 200 indicating that the switch K2 is open. The bi-directional current limiter 205 is also supplying a limited current of −10I to the current loop circuit 200. Thus, the current loop values indicate that the switch K1 is closed in zone 1 and switch K2 is open in zone 2. This indicates that zone 1 is experiencing an alarm condition and zone 2 is in standby mode.

During the third AC period (3T), the current loop value is +I for the positive cycle and −10I for the negative cycle. For the positive cycle, this is indicative that the current limiter 210 is providing a limited current of +I to the current loop circuit 200 indicating that the switch K1 is open. The bi-directional current limiter 205 is also supplying a limited current of +10I to the current loop circuit 200. For the negative cycle, this is indicative that the current limiter 215 is not providing any current to the current loop circuit 200 indicating that switch K2 is closed. The bi-directional current limiter 205 is supplying a limited current of −10I to the current loop circuit 200. Thus, the current loop values indicate that the switch K1 is open in zone 1 and switch K2 is closed in zone 2. This indicates that zone 1 is in standby mode and zone 2 is experiencing an alarm condition.

During the fourth AC period (4T), the current loop value is +10I for the positive cycle and −10I for the negative cycle. For the positive cycle, this is indicative that the current limiter 210 is not providing any current to the current loop circuit 200 indicating that switch K1 is closed. The bi-directional current limiter 205 is supplying a limited current of +10I to the current loop circuit 200. For the negative cycle, this is indicative that the current limiter 215 is also not providing any current to the current loop circuit 200 indicating that switch K2 is closed. The bi-directional current limiter 205 is supplying a limited current of −10I to the current loop circuit 200. Thus, the current loop values indicate that the switch K1 is closed in zone 1 and switch K2 is closed in zone 2. This indicates that zones 1 and 2 are both experiencing an alarm condition. Another explanation for this result is that there may be a short circuit in the current loop circuit 200.

During the fifth AC period (5T), the current loop value is 0 for the positive cycle and 0 for the negative cycle. This is indicative of an open loop condition that may indicate an alarm condition (e.g., wire broken) in the current loop circuit 200 meaning that the zone states do not matter and therefore cannot be evaluated.

Figure 4:
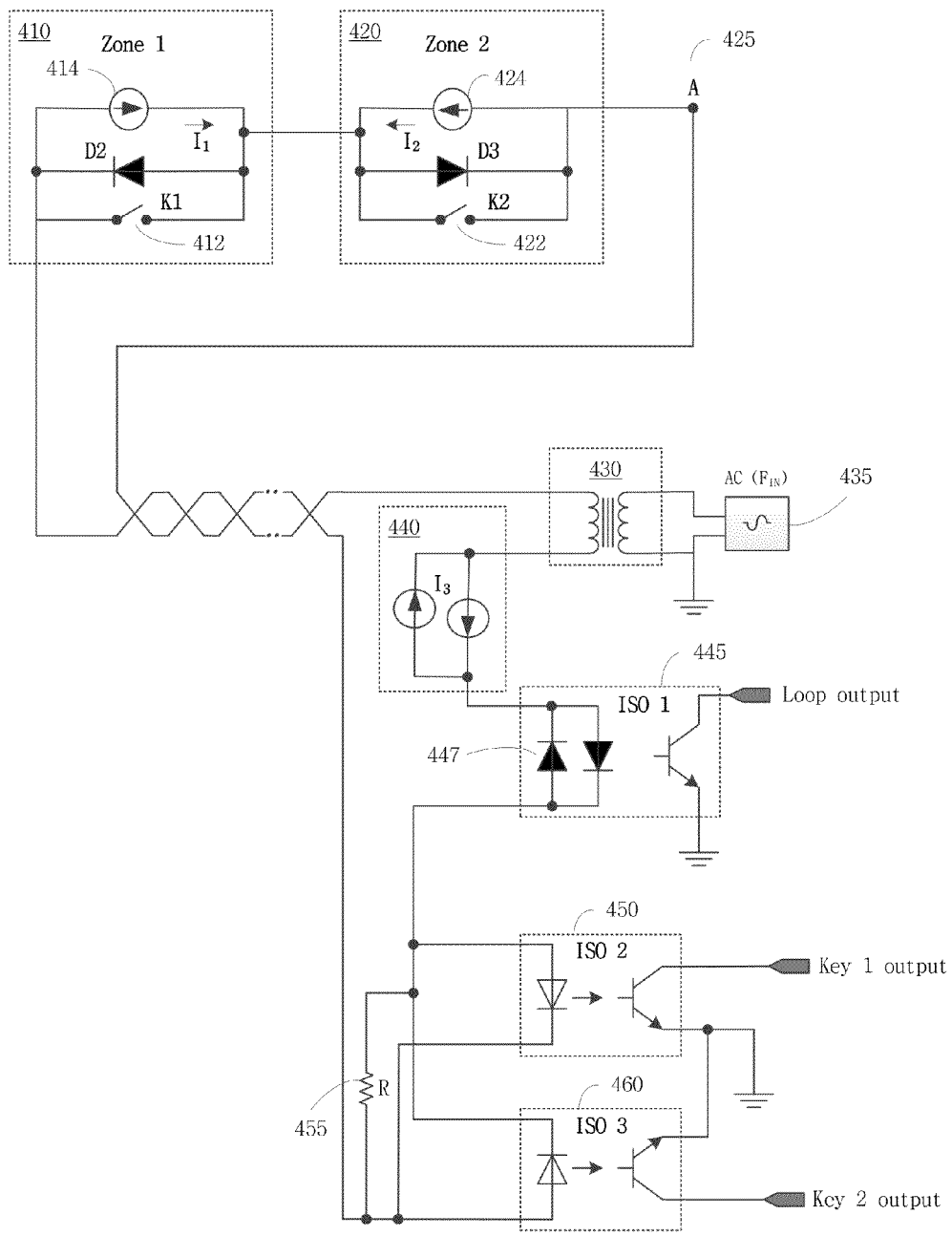
FIG. 4 illustrates a more detailed version of the simplified block diagram of FIG. 2 in accordance with an embodiment of the present disclosure.

FIG. 4 illustrates a more detailed version of the simplified block diagram of FIG. 2 in accordance with an embodiment of the present disclosure. Generally, the current loop circuit 400 uses an isolated dual zone input interface as an alternative signaling method to detect a zone status within a security system 10. The current loop circuit 400 is capable of monitoring up to two zones 410, 420 at a time and may be able to signal a failure in zone 1 410, a failure in zone 2 420, and a cable interrupted (e.g., an open loop condition). In addition, a shorted cable may react the same as an alarm for both zones 410 and 420.

Dual zone detection may be performed on both halves (e.g., positive and negative cycles) of an isolated AC signal wave generated by an AC signal wave generator 435. The isolated AC signal wave may be coupled in series with a bi-directional current limiter 440 that is limiting to a relatively high current referred to as $I_{OUTPUT}$. Sensors (e.g., detection devices $18_1 \ldots 18_n$) associated with zones 1 and 2 may be arranged in parallel with unidirectional current limiters 414, 424 that limit the loop current to a relatively low current referred to as $I_{SENSOR}$ such that $I_{SENSOR}=I_{OUTPUT}/10$. The current ratio $I_{OUTPUT}/I_{SENSOR}$ can be as high as ten (10) in this example and should remain high to ensure high noise immunity for the current loop circuit 400 as a whole.

If a switch 412, 422 within a zone 410, 420 is open, the loop current may be limited to $I_{SENSOR}$ for corresponding cycles of the AC signal wave as D2 and D3 conduct in tandem depending on the AC cycle. This may generate a bi-directional current limited to $I_{SENSOR}$ in the current loop circuit 400. When only one zone 410 or 420 has an alarm condition (e.g., a closed switch within a zone), the current during this AC cycle may increase to $I_{OUTPUT}$ in the current loop circuit 400. When both zones 410, 420 are in alarm mode (or if the cable is shorted) the current in the current loop circuit 400 is set to $I_{OUTPUT}$ for both AC cycles. The current loop circuit 400 includes, as a load, multiple opto-coupler circuits 445, 450, 460 capable of detecting the various zone states.

The advantages of the current loop circuit 400 include a high noise immunity since the current loop circuit 400 uses AC voltage. This includes both common mode noise because the current loop circuit 400 is floating and voltage additive noise because the current loop circuit 400 is a current loop. The current loop circuit 400 may also be tamper resistant due to a missing pulse detection method that ensures an extremely fast anti-tamper response. In addition, the current loop circuit 400 may power zones 1 410 and 2 420. The cable length among the zones 410, 420 and the opto-coupler circuits 445, 450, 460 may be limited only by the supplied voltage to the current loop circuit 400.

More specifically, zones 1 and 2, 410 and 420 respectively, may be coupled in series with an isolation transformer 430. An AC signal may be generated using a push-pull technique and two (2) pulse width modulation (PWM) outputs of a microcontroller (not shown) within AC signal generator 435. The isolated output which in this exemplary embodiment is a secondary coil of the isolation transformer 430, may be arranged in series with a bi-directional current limiter 440 set to limit current at a relatively high current.

Figure 5:
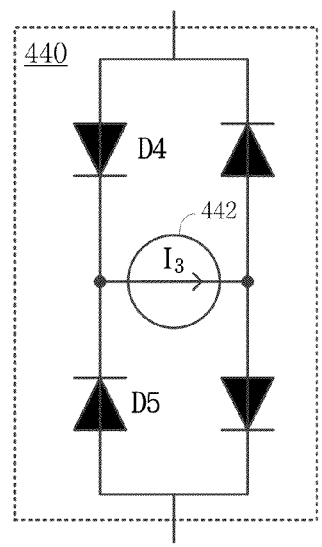
FIG. 5 illustrates a more detailed circuit block diagram of a bi-directional current limiter in accordance with an embodiment of the present disclosure.

The bi-directional current limiter 440 is further shown in FIG. 5 and comprises a unipolar current generator 442 and double diodes D4 and D5 that bi-directionally limit the current in the loop to $I_3$. $I_3$ may be referred to as $I_{OUTPUT}$. In another embodiment, a discrete diode bridge may be used in lieu of the double diodes D4 and D5.

Referring back to FIG. 4, line sensors (e.g., detection devices $18_1 \ldots 18_n$) within zone 1 410 and zone 2 420 may be coupled in parallel with unidirectional current limiters 414, 424 that limit the loop current to relatively low currents $I_1$ and $I_2$ respectively. $I_1$ and $I_2$ may also be referred to as $I_{SENSOR}$ in which $I_{SENSOR}=I_{OUTPUT}/10$, for example.

If a zone sensing circuit is open as indicated by switch K1 412 in zone 1 410 or switch K2 422 in zone 2 420, the loop current will be limited by $I_1$ or $I_2$ depending on the AC cycle. This condition will occur for both cycles of the AC signal wave and will cause a bi-directional current in the bi-directional current limiter 240 that is limited to $I_{OUTPUT}/10$. The bi-directional current limiter 440 ($I_3$) will be saturated.

When only one zone 410 or 420 exhibits an alarm condition, that zone's switch 412 or 422 will short one current limiter 214 or 224 and the bi-directional current limiter 240 current for its associated AC cycle will increase to $I_{OUTPUT}$. When both loops 410, 420 are in alarm mode—or if the cable is shorted—the bi-directional current limiter 440 current will be set for both AC cycles to $I_{OUTPUT}$. The current loop circuit 400 also includes opto-coupler based circuits 445, 450, 460 capable of detecting various states. An opto-coupler is a device that includes a source of light such as a light-emitting diode (LED) that converts an electrical input signal into light.

Opto-couplers ISO2 450 and ISO3 460 may only detect high loop currents (e.g., $I_{OUTPUT}=I_3$) because the voltage drop across resistor 455 achieved the forward voltage of the LEDs associated with opto-couplers ISO2 450 and ISO3 460 only for high currents (e.q. $I_{OUTPUT}$); if the current loop is limited at lower value (e.g., $I_{SENSOR}$) the voltage drop on 455 is much lower than opto-couple forward voltage and the opto-coupler will be kept OFF. For example, resistor 455 may be chosen to achieve an opto-coupler forward voltage when the loop current ($I_3$) is in its worst condition (e.g., maximum admitted loop resistance). The voltage drop across resistor 455 may not exceed the opto-coupler forward voltage because it is limited to the LED forward voltage (e.g., the LED acts as a zener diode in the circuit). Opto-coupler ISO1 445 may detect low and high current. The current ratio $I_{OUTPUT}/I_{SENSOR}$ may be chosen to ensure the noise immunity between states (e.g., $I_{OUTPUT} \gg I_{SENSOR}$). In this example, the $I_{OUTPUT}/I_{SENSOR}$ ratio is 10 but is not necessarily limited to this ratio. The current ratio may also be chosen to ensure that when $I_{OUTPUT}*R>V_{LED\_FORWARD}$ (if considering the opto-couplers 450 and 460 disconnected from the circuit) and limited to $V_{LED\_FORWARD}$ when the opto-coupler is placed in parallel with 455, the LEDs of ISO2 and ISO3 will be ON and when $I_{SENSOR}*R \ll V_{LED\_FORWARD}$, the LEDs of ISO2 and ISO3 will be OFF. $V_{LED\_FORWARD}$ may be characterized as the voltage necessary to trigger an LED ON and limited at its value by the LED diode characteristic. The voltage drop across resistor 455 is the voltage supplied to the opto-coupler circuits. When the voltage is sufficient, the LED will be ON. When the voltage is insufficient, the LED will be OFF.

Figure 6:
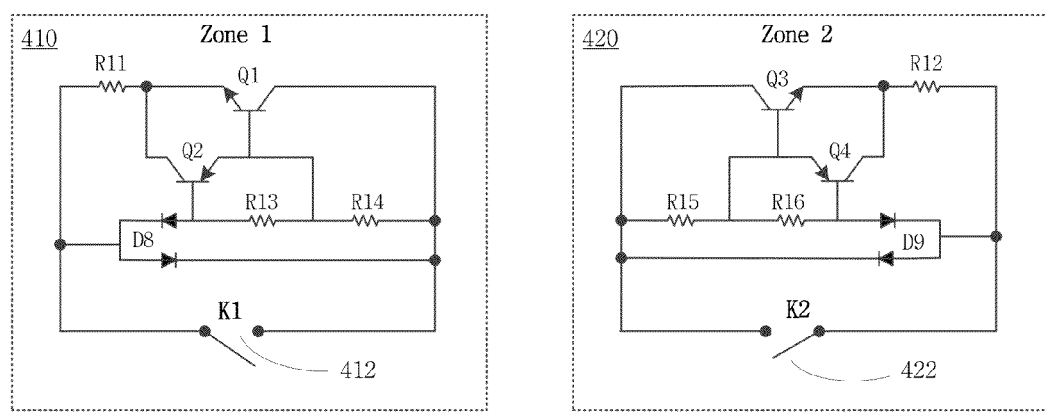
FIG. 6 illustrates a more detailed block diagram of zones 1 and 2 of FIG. 4.

One advantage of the current loop circuit block diagram 400 is that precision current limiters are not required so long as the $I_3/I_2$ and $I_3/I_1$ ratios are high enough (e.g., 10). FIG. 6 illustrates a more detailed circuit block diagram of zones 1 and 2 410, 420. Each zone 410, 420 utilizes a similar current limiter (e.g., Q1 and Q3) to limit current to a relatively low current that will remain constant for a wide range of voltages. The value of the current may be fixed by the voltage drop on R11 and R12. A reference voltage is kept by the voltage drop on the half side of D8 and D9 biased by the constant current of Q2 and Q4 respectively. Each current source Q1 and Q3 will regulate the current only for half the AC wave period in normal standby state. The current source(s) may be implemented in various ways, including, but not limited to, a JFET transistor or a depletion MOSFET transistor and a resistor.

FIG. 7 illustrates a state truth table for the zone status signaling system in accordance with an embodiment of the present disclosure. When in operation, the current loop circuit 400 may encounter six (6) scenarios. These scenarios include: (1) switch K1 412 open in zone 1 410 and switch K2 422 open in zone 420; (2) switch K1 412 closed in zone 1 410 and switch K2 422 open in zone 2 420; (3) switch K1 412 open in zone 1 410 and switch K2 422 closed in zone 2 420; (4) switch K1 412 closed in zone 1 410 and switch K2 422 closed in zone 420; (5) an "open loop" at node A 425 between zones 1 and 2 410, 420 and the isolation transformer 430; and (6) a short in the loop.

FIG. 7 describes each scenario with respect to the state of the switches (K1 and K2) 710, the AC cycle 720, the loop current value 730, the output frequency of the LOOP signal 740 for ISO1 445, and the output keys 750, 760 for opto-couplers ISO2 450 and ISO3 460.

In scenario 1, switch K1 412 is open in zone 1 410 and switch K2 422 is open in zone 420. The loop associated with opto-coupler ISO1 445 is pulsing resulting in a signal of $2*F_{IN}$ in which ISO1 445 is OFF around the AC loop zero crossing. During the +ve cycle of the AC signal the loop current will be limited to $I_1$ based on switch 412 being open. Output key 1 of opto-coupler ISO2 250 will be OFF indicative of high impedance. During the −ve cycle of the AC signal the loop current will also be limited to $I_2$ based on switch 422 being open. Output key 2 of opto-coupler ISO3 460 will also be OFF. Thus, the zone status for this scenario indicates that the loop is OK based on the presence of the LOOP signal $2*F_{IN}$ and both zones are in standby mode. Standby mode indicates there is no alarm condition on any of the sensors (e.g., detection devices $18_1 \ldots 18_n$) associated with either zone 1 410 or zone 2 420.

In scenario 2, switch K1 412 is closed in zone 1 410 and switch K2 422 is open in zone 2 420. The loop associated with opto-coupler ISO1 445 is pulsing resulting in a signal of $2*F_{IN}$ in which ISO1 245 is off around the AC loop zero crossing. During the +ve cycle of the AC signal the loop current will be limited to $I_3$ (which is $10*I_1$) based on switch 412 being closed. Output key 1 of opto-coupler ISO2 450 will be ON. The ON state may be represented by "LO" logic if the opto-coupler 450 is biased. During the −ve cycle of the AC signal the loop current will be limited to $I_2$ based on switch 422 being open and output key 2 of opto-coupler ISO3 460 will be OFF. Thus, the zone status indicates that the loop is OK. Zone 1 indicates an alarm mode based on the ON status of output key 1 while zone 2 is in standby mode based on the OFF status of output key 2. An alarm mode may indicate that one or more of the sensors (e.g., detection devices $18_1 \ldots 18_n$) associated with a zone have been tripped.

In scenario 3, switch K1 412 is open in zone 1 410 and switch K2 422 is closed in zone 2 420. The loop associated with opto-coupler ISO1 445 is pulsing resulting in a signal of $2*F_{IN}$ in which ISO1 245 is off around the AC loop zero crossing. During the +ve cycle of the AC signal the loop current will be limited to $I_1$ based on switch 412 being open. Output key 1 of opto-coupler ISO2 450 will be OFF. During the −ve cycle of the AC signal the loop current will be limited to $I_3$ based on switch 422 being closed and output key 2 of opto-coupler ISO3 460 will be ON. Thus, the zone status indicates that the loop is OK. Zone 1 is in standby mode based on the OFF status of output key 1 while zone 2 indicates an alarm mode based on the ON status of output key 2.

In scenario 4, switch K1 412 is closed in zone 1 410 and switch K2 422 is closed in zone 420. The loop associated with opto-coupler ISO1 445 is pulsing resulting in a signal of $2*F_{IN}$. During the +ve cycle of the AC signal the loop current will be limited to $I_3$ based on switch 412 being closed and key 1 of opto-coupler ISO2 450 will be ON. During the −ve cycle of the AC signal the loop current will be limited to $I_3$ based on switch 422 being closed and key 2 of opto-coupler ISO3 460 will be ON. Thus, the zone status indicates that the loop is OK. Zone 1 and zone 2 both indicate an alarm mode based on the ON status of key 1 and key 2.

In scenario 5, the loop is open at node "A" 425 meaning that the zone states do not matter and cannot be evaluated. The Loop output associated with opto-coupler ISO1 445 is OFF (not pulsing if biased). ISO2 450 and ISO3 460 are also both OFF. Thus, the zone status indicates that the loop is not OK indicating a sensor loop fault in the security system 10.

In scenario 6, the current loop is shorted and the zone states do not matter. Current may be regulated for both +ve and −ve AC cycles by the bi-directional current source 442 in current limiter 440 and limited to $I_3$ (e.g., 10 mA). The loop associated with opto-coupler ISO1 445 may still pulse resulting in a signal of $2*F_{IN}$ which is twice the AC signal frequency of the AC signal generator 435. The state of output key 1 of opto-coupler ISO2 450 and output key 2 of opto-coupler ISO3 460 will mimic that of scenario 4 thereby setting output key 1 of opto-coupler ISO2 450 ON and output key 2 of opto-coupler ISO3 460 ON.

FIG. 8 illustrates one embodiment of a logic flow 800 that describes a process of zone signaling in a security system 10. The logic flow 800 may be representative of some or all of the operations executed by one or more embodiments described herein.

In the illustrated embodiment shown in FIG. 8, the logic flow 800 may generate an AC signal wave having a positive cycle and a negative cycle at block 810. For example, an AC signal may be generated using a push-pull technique and two (2) pulse width modulation (PWM) outputs of a microcontroller within AC signal generator 435. The isolated output in this embodiment is a secondary coil of the isolation transformer 430. The embodiments are not limited to these examples.

The logic flow 800 may limit a loop current resulting from the generated AC signal to a value ($I_3$) using a bi-directional current limiter 440 at block 820. For example, the AC signal generator, combination 435 and 430, may be arranged in series with the bi-directional current limiter 440 set to limit current at a relatively high current. The embodiments are not limited to these examples.

The logic flow 800 may further limit the loop current resulting from the generated AC signal to a value ($I_1$) using a unidirectional current limiter 414 in a first zone 410 or a value ($I_2$) using a unidirectional current limiter 424 in a second zone 420, $I_1$ and $I_2$ being proportionally less than $I_3$ at block 830. The embodiments are not limited to these examples.

The logic flow 800 may monitor a first opto-coupler circuit (ISO1) 445 that detects high or low current states for the loop current at block 840. The logic flow 800 may also monitor a second opto-coupler circuit (ISO2) 450 associated with the first zone 410 at block 850. ISO2 may be configured to detect only high current states during the positive cycle of the AC signal wave. The logic flow 800 may further monitor a third opto-coupler circuit (ISO3) 460 associated with the second zone 420 at block 860. ISO3 may be configured to detect only high current states during the negative cycle of the AC signal wave. The embodiments are not limited to these examples.

The logic flow 800 may determine a state of a zone based on the various opto-coupler circuit outputs for two consecutive AC half cycles at block 870. A more complete description of the various zone states has been presented above with respect to FIG. 7. The embodiments are not limited to these examples.

Figure 9:
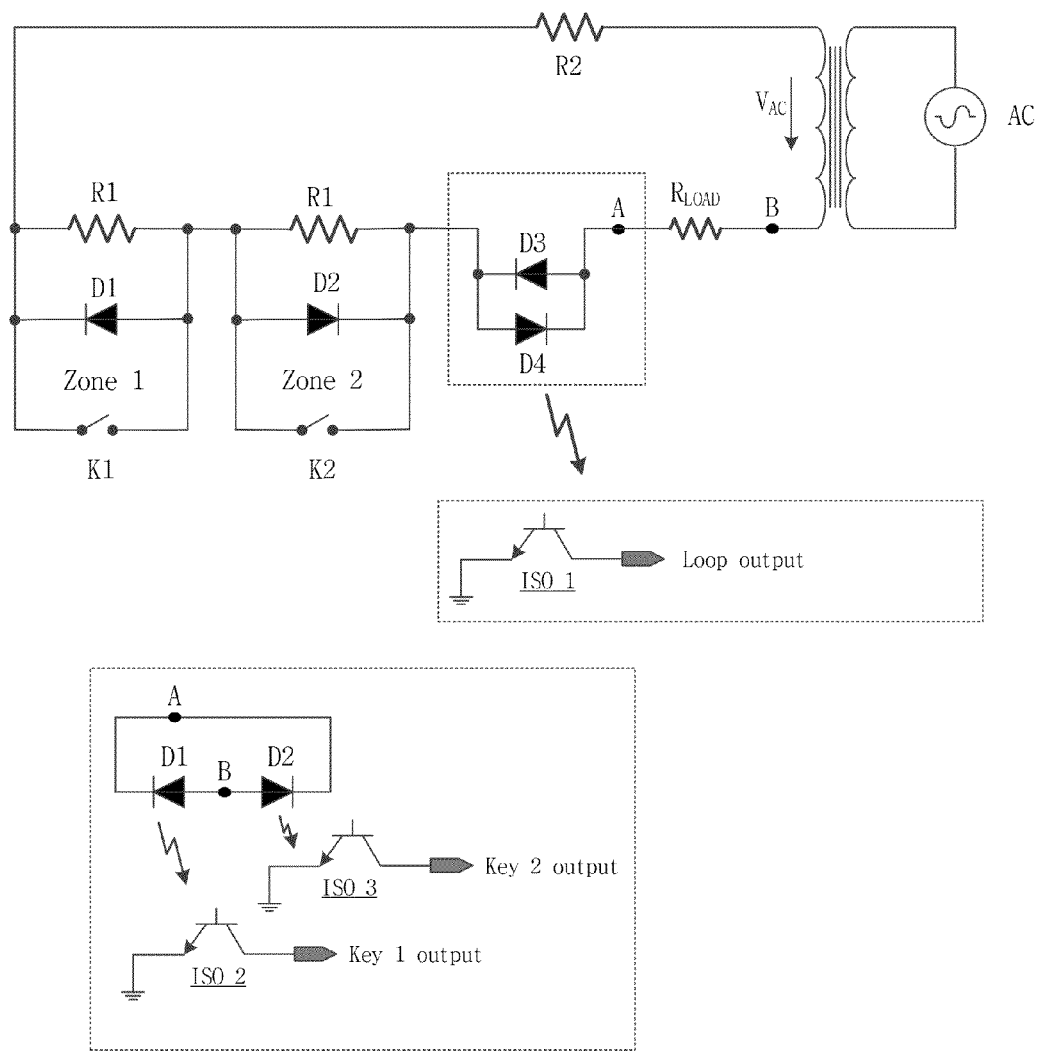
FIG. 9 illustrates another embodiment of simplified block diagram for a zone status signaling circuit in accordance with an embodiment of the present disclosure.

FIG. 9 illustrates another embodiment of simplified block diagram for a zone status signaling circuit 800 in accordance with an embodiment of the present disclosure. In this embodiment the current limiters have been replaced with large resistors. R1 replaces the unidirectional current limiters in zones 1 and 2 and R2 replaces the bi-directional current limiter. The values of $R_1$ and $R_2$ may be chosen with respect to $V_{AC}$ to ensure a comfortable current for a first opto-coupler circuit (ISO1) associated with the loop current. ISO1 has to be able to pulse the output for the maximum cable loop length when switches K1 and K2 are both open.

Diodes D1 and D2 in zones 1 and 2 respectively, will pulse current when the AC signal is in a cycle that is consistent with the direction of the diode. Depending on the AC cycle, one of diodes D3 and D4 will pulse current so long as there is no open circuit condition in the loop as a whole. The existence of a loop current will trigger ISO1 such that the loop output state may be determined. Depending on the AC cycle, one of diodes D1 and D2 will also pulse current so long as there is no open circuit condition in the loop as a whole. The existence of a current in either of D1 or D2 may trigger opto-coupler circuit (ISO2) or (ISO3) such that a zone status may be determined. The value of $R_{LOAD}$ may be chosen to ensure there is no output on ISO2 and ISO3 when switches K1 or K2 are both open but have a pulsed output on ISO2 or ISO3 when switch K1 or K2 is closed.

While the present invention has been disclosed with reference to certain embodiments, numerous modifications, alterations and changes to the described embodiments are possible without departing from the sphere and scope of the present disclosure, as defined in the appended claims. Accordingly, it is intended that the present invention not be limited to the described embodiments, but that it has the full scope defined by the language of the following claims, and equivalents thereof.

What is claimed is:

1. A current loop circuit comprising:
   an AC signal generator to generate an AC signal having a positive half cycle and a negative half cycle;
   a bi-directional current limiter configured to receive the AC signal and bi-directionally limit the loop current to a predetermined current value ($I_3$);
   a first zone configured to receive the AC signal, the first zone including a unidirectional current limiter to limit a unidirectional current ($I_1$) that is proportionately less than the bi-directionally limited current $I_3$;
   a second zone configured to receive the AC signal, the second zone including a unidirectional current limiter to limit a unidirectional current ($I_2$) that is proportionally less than the bi-directionally limited current $I_3$;
   a first opto-coupler circuit (ISO1) configured to detect both high and low current states in the current loop circuit;
   a second opto-coupler circuit (ISO2) associated with the first zone and configured to detect only high current states in the current loop circuit; and
   a third opto-coupler circuit (ISO3) associated with the second zone and configured to detect only high current states in the current loop circuit.

2. The current loop circuit of claim 1, the first zone active on the positive half cycle of the generated AC signal wave and further comprising a switch (K1) to detect a zone status such that when the switch (K1) is open the loop current is $I_1$ and ISO2 yields a status of OFF; and when the switch (K1) is closed the loop current is $I_3$ and ISO2 yields a status of ON.

3. The current loop circuit of claim 1, the second zone active on the negative half cycle of the generated AC signal and further comprising a switch (K2) to detect a zone status such that when the switch (K2) is open the loop current is $I_2$ and ISO3 yields a status of OFF; and when the switch (K2) is closed the loop current is $I_3$ and ISO3 yields a status of ON.

4. The current loop circuit of claim 1, ISO2 and ISO3 each including an LED that emits light when a status is ON during a corresponding half cycle of the generated AC signal, the ON status known after a complete AC cycle.

5. The current loop circuit of claim 1, ISO1 to yield a status of OFF when there is an open loop condition in the current loop.

6. The current loop circuit of claim 1, the AC signal generator to generate the AC signal using a push-pull technique and two (2) pulse width modulation (PWM) outputs of a microcontroller in which the isolated output is the secondary coil of an isolation transformer.

7. The current loop circuit of claim 1, wherein:
   $I_1$ is equal to $I_2$; and
   $I_1/I_3$ and $I_2/I_3$ is approximately 0.1.

8. A method of zone signaling in an alarm system using a current loop circuit, the method comprising:
   generating an AC signal wave having a positive half cycle and a negative half cycle;
   limiting a loop current resulting from the generated AC signal to a value ($I_3$) using a bi-directional current limiter;
   further limiting the loop current resulting from the generated AC signal to a value ($I_1$) using a unidirectional current limiter in a first zone or a value ($I_2$) using a unidirectional current limiter in a second zone, $I_1$ and $I_2$ being proportionally less than $I_3$;
   monitoring a first opto-coupler circuit (ISO1), ISO1 to detect high or low current states for the loop current;
   monitoring a second opto-coupler circuit (ISO2) associated with the first zone, ISO2 to detect only high current states during the positive half cycle of the AC signal wave; and
   monitoring a third opto-coupler circuit (ISO3) associated with the second zone, ISO3 to detect only high current states during the negative half cycle of the AC signal wave.

9. The method of claim 8, further comprising:
   determining the state of a switch (K1) in the first zone such that when the switch (K1) is open the loop current is $I_1$ and ISO2 yields a status of OFF; and when the switch (K1) is closed the loop current is $I_3$ and ISO2 yields a status of ON during a corresponding half cycle of the generated AC signal, the ON status known after a complete AC cycle.

10. The method of claim 8, further comprising:
    determining the state of a switch (K2) in the second zone such that when the switch (K2) is open the loop current is $I_2$ and ISO3 yields a status of OFF; and when the switch (K2) is closed the loop current is $I_3$ and ISO3 yields a status of ON.

11. The method of claim 8, ISO2 and ISO3 each including an LED that emits light when a status is ON during a corresponding half cycle of the generated AC signal, the ON status known after a complete AC cycle.

12. The method of claim 8, ISO1 to yield a status of OFF when there is an open loop condition in the current loop.

13. The method of claim 8, wherein:
    $I_1$ is equal to $I_2$; and
    $I_1/I_3$ and $I_2/I_3$ is approximately 0.1.

14. A zone status detection circuit comprising:
    an AC signal generator to generate an AC signal having a positive half cycle and a negative half cycle coupled in series with:
    a first resistor having a value R2 that ensures a comfortable current for a first opto-coupler circuit (ISO1), the first opto-coupler circuit (ISO1) configured to detect current in the zone status detection circuit;
    a first zone including a resistor of value R1 coupled in parallel with a first diode conductive during the positive half cycle and a first switch (K1), the first zone associated with a second opto-coupler circuit (ISO2) configured to detect a voltage on the resistor in the first zone;

a second zone including a resistor of value R1 coupled in parallel with a second diode conductive during the negative half cycle and a second switch (K2), the second zone associated with a third opto-coupler circuit (ISO3) configured to detect a voltage on the resistor in the second zone; and a load resistor ($R_{LOAD}$) set to a value to ensure there is no output on ISO2 and ISO3 when switches K1 and K2 are both open but have a pulsed output on ISO2 or ISO3 when either switch K1 or K2 is closed.

* * * * *